US010117358B2

(12) United States Patent
Karaaslan et al.

(10) Patent No.: US 10,117,358 B2
(45) Date of Patent: Oct. 30, 2018

(54) COOLING ARCHITECTURE FOR A CHASSIS WITH ORTHOGONAL CONNECTOR SYSTEM

(71) Applicant: VSS Monitoring, Inc., Sunnyvale, CA (US)

(72) Inventors: Ufuk Karaaslan, Sunnyvale, CA (US); Ilia Bokchtein, Santa Clara, CA (US); James Crim, San Francisco, CA (US)

(73) Assignee: VSS Monitoring, Inc., Sunnyvale, CA (US)

( * ) Notice: Subject to any disclaimer, the term of this patent is extended or adjusted under 35 U.S.C. 154(b) by 40 days.

(21) Appl. No.: 14/572,401

(22) Filed: Dec. 16, 2014

(65) Prior Publication Data
US 2016/0174412 A1 Jun. 16, 2016

(51) Int. Cl.
H05K 7/20 (2006.01)

(52) U.S. Cl.
CPC ..... H05K 7/20563 (2013.01); H05K 7/20536 (2013.01); H05K 7/20 (2013.01); H05K 7/20554 (2013.01)

(58) Field of Classification Search
None
See application file for complete search history.

(56) References Cited

U.S. PATENT DOCUMENTS

| | | | | |
|---|---|---|---|---|
| 7,722,359 B1 * | 5/2010 | Frangioso, Jr. | .... | H05K 7/20563 361/679.48 |
| 8,064,200 B1 * | 11/2011 | West | ................. | H05K 7/20563 361/694 |
| 2005/0207134 A1 * | 9/2005 | Belady | ..................... | H05K 1/14 361/796 |
| 2006/0126292 A1 * | 6/2006 | Pfahnl | ................ | H05K 7/20563 361/695 |
| 2007/0274039 A1 * | 11/2007 | Hamlin | ................ | H05K 7/2019 361/695 |
| 2008/0257639 A1 * | 10/2008 | Yamaguchi | ........ | H05K 7/20736 181/198 |
| 2009/0213544 A1 * | 8/2009 | Dittus | ................ | H05K 7/20727 361/695 |
| 2013/0235524 A1 * | 9/2013 | Baba | ..................... | H05K 7/1452 361/695 |
| 2013/0329364 A1 * | 12/2013 | Kameno | ............ | H05K 7/20563 361/697 |

(Continued)

Primary Examiner — Dimary Lopez Cruz
Assistant Examiner — Zhengfu Feng
(74) Attorney, Agent, or Firm — Locke Lord LLP; Scott D. Wofsy; Christopher J. Capelli

(57) ABSTRACT

An electronic equipment chassis assembly includes a housing, and a plurality of openings defined in the housing that allow airflow there-through. The openings include at least one intake opening defined in the front surface of the housing and at least one exit opening defined in the rear surface of the housing. The chassis also includes an air filter, and one or more rails disposed within the housing defining receiving slots that releasably secure a first plurality of circuit boards, and a second plurality of circuit boards, which second plurality of circuit boards are orthogonally oriented relative to the first plurality of circuit boards. The chassis includes an airflow assembly proximate the top surface of the housing, and one or more output fans proximate the rear surface of the housing. The airflow assembly and the output fans balance airflow throughout the chassis.

20 Claims, 8 Drawing Sheets

(56) References Cited

U.S. PATENT DOCUMENTS

2014/0078668 A1\* 3/2014 Goulden ............ H05K 7/20736
361/679.47
2015/0351233 A1\* 12/2015 Peterson .............. H05K 1/0278
361/785

\* cited by examiner

COOLING ARCHITECTURE FOR A CHASSIS WITH ORTHOGONAL CONNECTOR SYSTEM

BACKGROUND

1. Field of the Invention

The present disclosure relates generally to the design of equipment chassis such as a network chassis, and more specifically, to improved air flow and cooling techniques for network chassis.

2. Description of the Related Art

Networked communication systems typically include various hardware components such as network chassis (and sub-components) that support the overall network functionality. These various hardware components generate large amounts of heat, which is typically removed continuously to prevent resident electronic components from reaching elevated temperatures, resulting in degraded performance, damage, or even failure. Conventionally, the heat is removed by, for example, forced convection airflow through or around the heat producing electronic components.

A conventional networking chassis typically includes sub-components such as network circuit boards or line cards, which contain circuits and the external interface connectors, and fabric cards, which contain switching circuits for connecting line cards. To achieve the highest degree of connectivity between line cards and fabric cards; high-performance network switches use an orthogonal mid-plane design where the line cards are oriented in one direction (either horizontal or vertically) and are inserted into the mid-plane from the front of the chassis, while the fabric cards are oriented in a direction orthogonal to the line cards and are inserted into the mid-plane from the rear of the chassis.

Conventionally, orthogonal chassis designs typically use one of two methods of cooling. The first method uses multiple airflow paths to cool each set of cards—e.g., horizontal line cards can be cooled using side-to-side airflow, while vertical cards are cooled using separate blowers. However, such side-to-side chassis airflow requires cooler air entry on sides of each network chassis, which may not be supported for certain data center designs (e.g., limited space available). The second method uses front to rear cooling where air enters through air intake holes in the faceplates of front boards. In most applications, the face plate is covered by many connectors that restrict the location and number of the holes which in turn causes difficulties with the delivery of air to the parts of the circuit that most need it. The second method fails to consider air filtering requirements for certain network applications (e.g., telecommunications networks).

Accordingly, there remains a need for a space efficient network chassis that satisfies the heat dissipation requirements for the various sub-components in an orthogonal configuration and also satisfies the air filtering requirements for certain network applications.

SUMMARY

The devices, systems, and cooling techniques discussed herein provide for an improved cooling architecture for equipment chassis, particularly network chassis (including orthogonal network chassis). Such devices, systems, and techniques provide for balanced airflow throughout the equipment chassis using airflow assemblies that facilitate airflow through air filters, and through vertically oriented circuit boards, as well as output fans that facilitate a portion of the airflow from the airflow assemblies through corresponding circuit boards horizontally oriented.

According to one embodiment of this disclosure, an electronic equipment chassis assembly includes a housing having a top surface, a bottom surface opposite the top surface, a front surface, and a rear surface opposite the front surface. The front surface and the rear surface separate the top surface and the bottom surface. The chassis also includes a plurality of openings defined in the housing that allow airflow there-through. These openings include at least one intake opening defined in the front surface of the housing (e.g., proximate the bottom surface of the chassis) and at least one exit opening defined in the rear surface of the housing. The chassis also includes an air filter, operatively coupled to at least a portion of the openings (e.g., the intake openings), and one or more rails disposed within the housing that define receiving slots for circuit boards. For example, the receiving slots releasably secure a first plurality of circuit boards and a second plurality of circuit boards in parallel configurations, respectively, with the second plurality of circuit boards in an orthogonal orientation relative to the first plurality of circuit boards. Further, the rails define a minimum distance between each receiving slot for respective circuit boards to facilitate airflow between each circuit board. As discussed above, the chassis promotes airflow, in part, using an airflow assembly, which is located proximate the top surface of the housing.

The airflow assembly facilitates airflow through the intake opening, the air filter, and between each circuit board of the first plurality of circuit boards. For example, the airflow assembly can include at least one air blower that facilitates a portion of airflow through the intake opening, the air filter, between each circuit board of the first plurality of circuit boards, and through the exit opening, and at least one auxiliary fan that facilitates a portion of airflow through the intake opening, the air filter, and between each circuit board of the first plurality of circuit boards.

The chassis balances airflow between the first plurality of circuit boards and the second plurality of circuit boards using one or more output fans, which redirect a portion of the volume of airflow from the air intake between the second plurality of circuit boards. In particular, the one or more output fans are located proximate the rear surface of the housing and redirect at least a portion of airflow from the air intake between each circuit board of the second plurality of circuit boards, and through the exit opening.

In certain embodiments, the electronic chassis also includes one or more electrical connectors (e.g., to provide signaling, power, etc.), which couple with at least one circuit board of the first plurality of circuit boards and with at least one circuit board of the second plurality of circuit boards. The electrical connectors are disposed within the housing proximate an interior surface of the housing and parallel to a plane formed by an orthogonal interconnection between at least one circuit board of the first plurality of circuit boards and at least one circuit board of the second plurality of circuit boards.

According to another embodiment of this disclosure, the network chassis also includes impediment cards or "dummy" cards. An impediment card is particularly configured to obstruct airflow substantially similar to at least one circuit board of the first plurality of circuit boards and the second plurality of circuit boards. The impediment card is used to maintain consistent airflow throughout network chassis when, for example, one or more circuit boards of the first or second plurality of circuit boards is absent from a slot. The impediment card is disposed in such empty slot and obstructs or impedes airflow the same (or substantially similar) to a circuit board in order to maintain the consistent airflow throughout the chassis. The impediment card obstructs or impedes airflow through one or more baffles. Such baffles are typically situated about the impediment card to obstruct airflow similar to circuitry of one of the first or second plurality of circuit boards.

These and other features of the systems and methods of the subject invention will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain figures, wherein.

A component or a feature that is common to more than one drawing is indicated with the same reference number in each of the drawings.

DESCRIPTION OF EXAMPLE EMBODIMENTS

Figure 1:
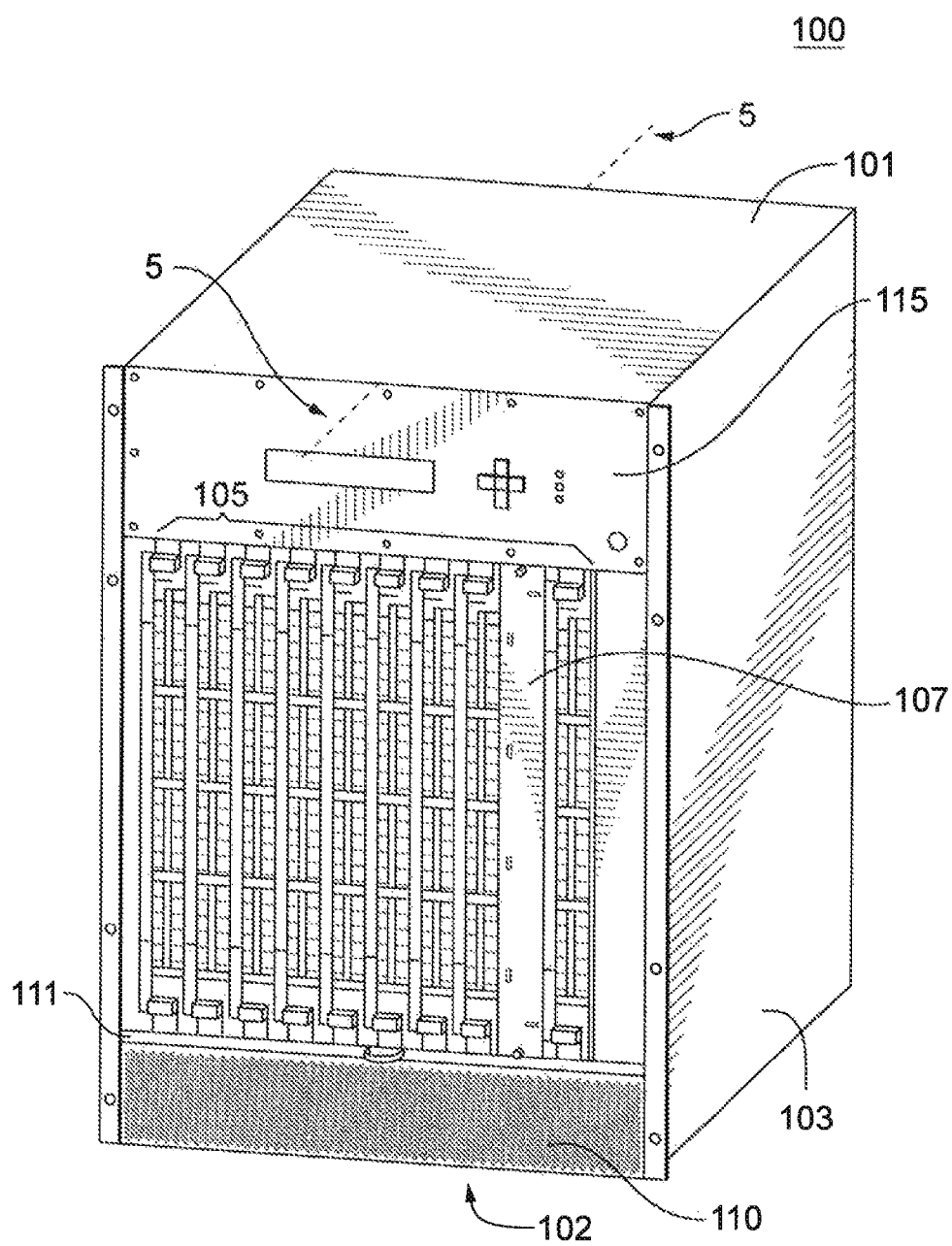
FIG. 1 illustrates a front perspective isometric view of a network chassis according to the present disclosure, showing vertically mounted network circuit boards.

As used throughout this document, words such as "comprise", "including" and "having" are intended to set forth certain items, steps, elements or aspects of something in an open-ended fashion. Unless a specific statement is made to the contrary, these words do not indicate a closed-end list to which additional things cannot be added.

In general, the designations "front", "rear", "top", "bottom", "left" and "right" are used here-in to designate relative positions. These designations should not be construed as absolute positions.

Reference will now be made to the drawings wherein like reference numerals identify similar structural features or aspects of the subject invention. For purposes of explanation and illustration, and not limitation, a partial view of an exemplary embodiment of an electronic equipment chassis assembly, also referred to as network chassis, in accordance with the invention is shown in FIG. 1 and is designated generally by reference character 100.

Additional features of the electronic equipment chassis in accordance with this disclosure, or aspects thereof, are provided in FIGS. 2-7, as will be described. The electronic equipment chassis, including the improved cooling architecture, can be used, for example, for network electronic equipment such as servers, switches, routers, and the like, as is appreciated by those skilled in the art.

As shown in FIG. 1, a front perspective isometric view of the network chassis 100 is illustrated. As shown, the network chassis generally includes a housing having a top surface 101 and a bottom surface 102 with one or more side surfaces 103 (here, showing a front side surface and one side surface) defined there-between.

Network chassis 100 is configured to receive a plurality of modular circuit boards (e.g., network cards). As shown in FIG. 1, the network chassis includes a first plurality of circuit boards 105 mounted in a parallel vertical direction. Such circuit boards 105 are releasably secured to the network chassis 100 (particularly the front surface of network chassis 100) by, for example, releasable clamps, screws, and other means, appreciated by those skilled in the art. Additionally, one or more impediment cards 107 can be placed within or next to the plurality of circuit boards 105. Impediment card 107 is a "dummy" card that includes one or more baffles that provide similar airflow characteristics as a normal circuit board (e.g., by obstructing certain portions of airflow). That is, impediment cards 107 act as fill-in cards (e.g., substitute cards) to maintain specific airflow characteristics throughout network chassis 100 (e.g., when one or more slots of network chassis 100 are empty).

Still referring to FIG. 1, network chassis 100 also includes an air intake 110, which includes a plurality of openings or holes that allow airflow there-through, and an airflow assembly 115 proximate the top surface 101 of the network chassis 100. Operatively, as discussed in greater detail below, the airflow assembly 115, in conjunction with the air intake 110, facilitates airflow through the plurality of openings of air intake 110, an air filter 111, and between each of the first plurality of vertically oriented circuit boards 105.

Figure 2:
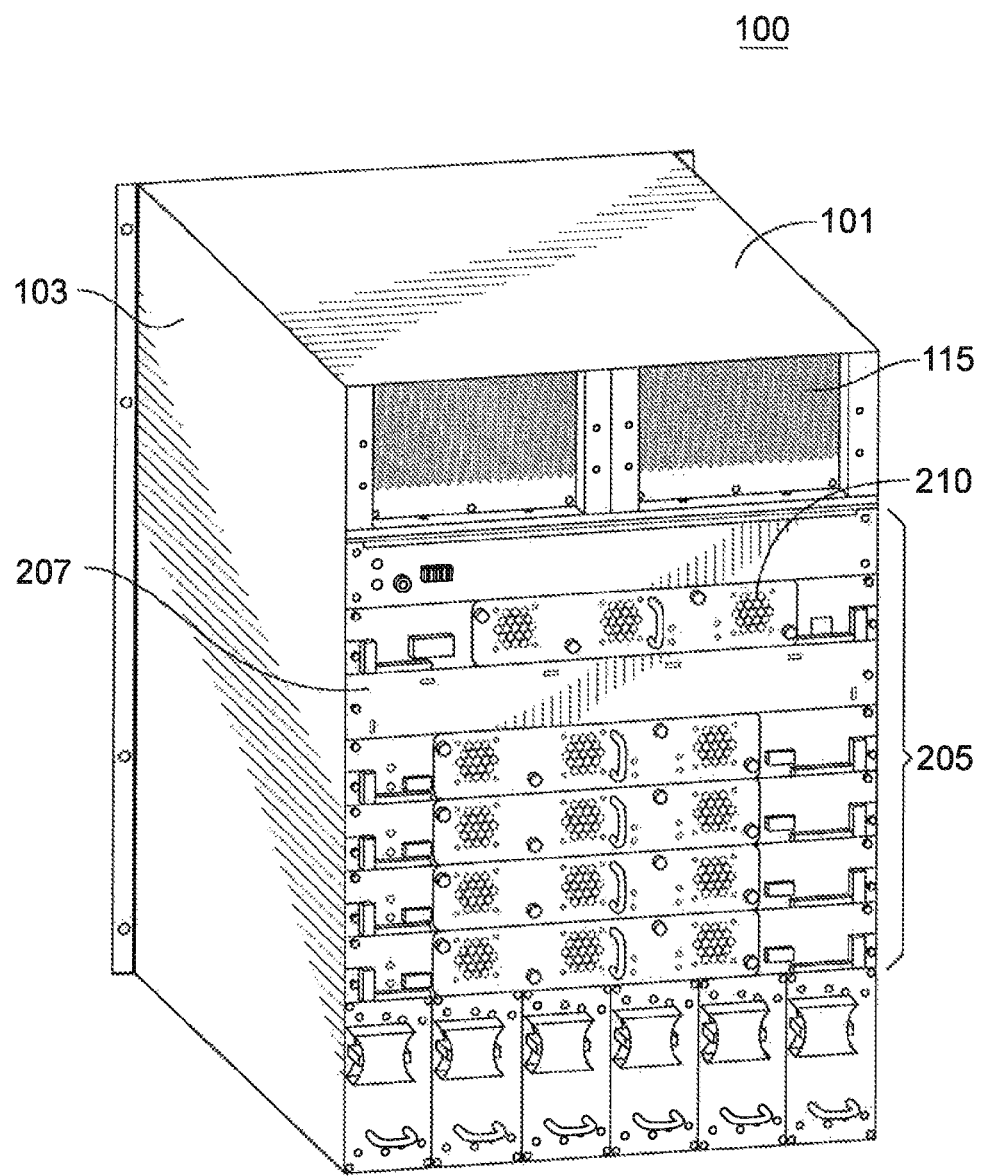
FIG. 2 illustrates a rear perspective isometric view of the network chassis, showing horizontally mounted circuit boards, orthogonal to the vertically mounted network circuit boards shown in FIG. 1.

FIG. 2 illustrates a rear perspective isometric view of the network chassis 100. As shown, network chassis 100 is also configured to receive a second plurality of circuit boards 205 mounted in a parallel horizontal direction. Notably, the second plurality of circuit boards 205 include orthogonal connectors that couple with the first plurality of vertically mounted parallel circuit boards 105. Output fans 210 are mounted to corresponding circuit boards of the second plurality of circuit boards 205, so as to operatively facilitate airflow through spaces between each of the second plurality of circuit boards and out of the exit openings corresponding to each output fan. Further, as shown, additional exit openings are located on a rear portion of airflow assembly 115.

One or more impediment cards 207, like impediment card 107, are also shown in FIG. 2. Such impediment card 207 prevents air entering chassis 100 from its rear side.

Figure 3:
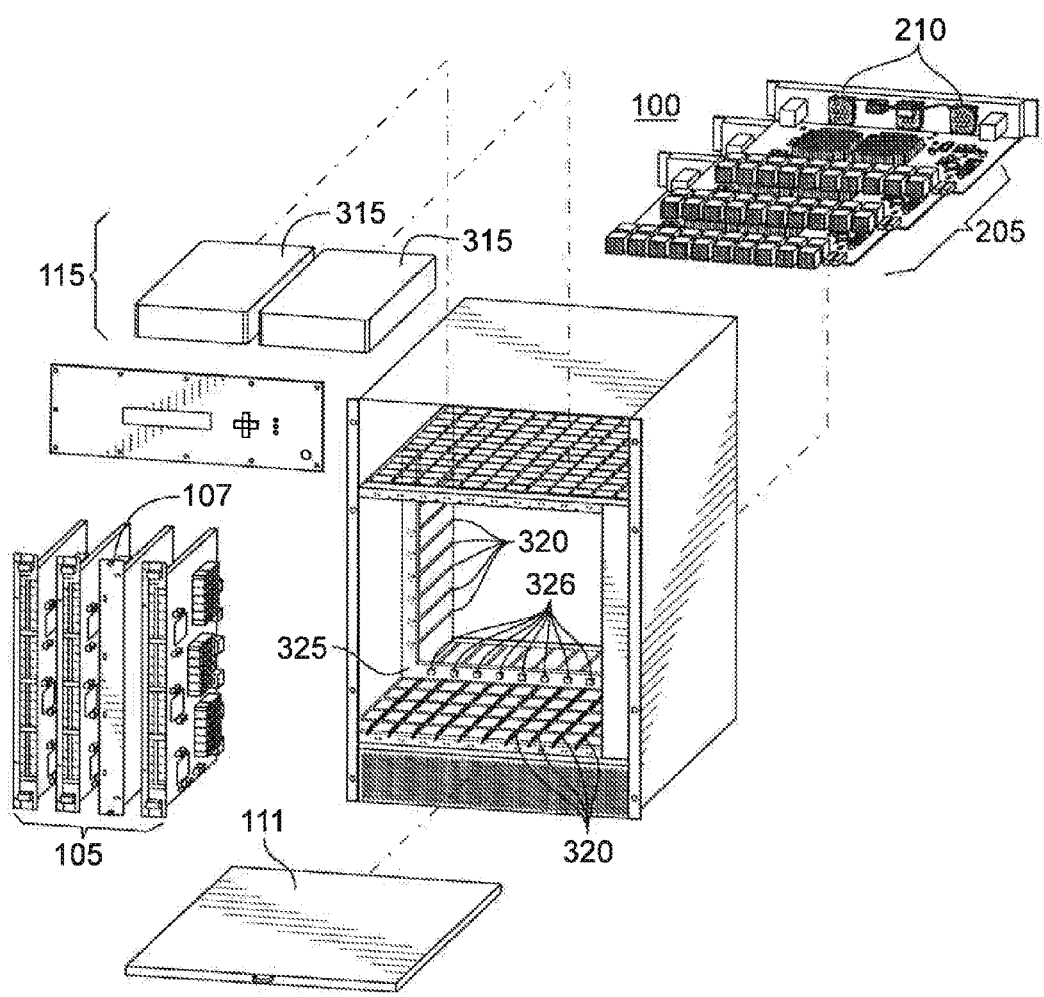
FIG. 3 illustrates an exploded front perspective view of the network chassis shown in FIG. 1.

FIG. 3 illustrates a front exploded perspective view of network chassis 100. As discussed above, network chassis 100 is configured to receive a plurality of modular circuit boards, both vertically oriented circuit boards 105 and horizontally oriented circuit boards 205. In particular, network chassis includes one or more rails 320 that define receiving slots to releasably secure circuit boards 105 and circuit boards 205, in respective parallel configurations. These rails 320 are spaced to define a minimum distance between each receiving slot for corresponding circuit boards to facilitate airflow between each circuit board of the first plurality of circuit boards 105 and each circuit board of the second plurality of circuit boards 205.

Further, network chassis 100 also includes a mid-plane 325 that interconnects the various circuit boards and other components that are inserted from the front and the rear of network chassis 100. For example, mid-plane 325 includes connectors 326 that provide electrical signals, power, and the like, to the various circuit boards. Mid-plane 325 is located proximate along an interior perimeter of network chassis 100 and is parallel to a plane formed by an orthogonal interconnection between the circuit boards 105 and circuit boards 205. Mid-plane forms a minimal interface in order to provide maximal air flow between the first plurality of network cards 105, mounted to the front of network chassis 100, and the second plurality of network cards 205, mounted to the rear of network chassis 100.

FIG. 3 also shows airflow assembly 115 as including two fan assemblies 315—each fan assembly including various air blowers and fans (discussed below). Airflow assembly 115 is shown as including two fan assemblies 315 for purposes of illustration, not limitation as it is to be understood and appreciated that fewer or even additional fan assemblies can be used, as is appreciated by those skilled in the art.

Figures 4A, 4B:
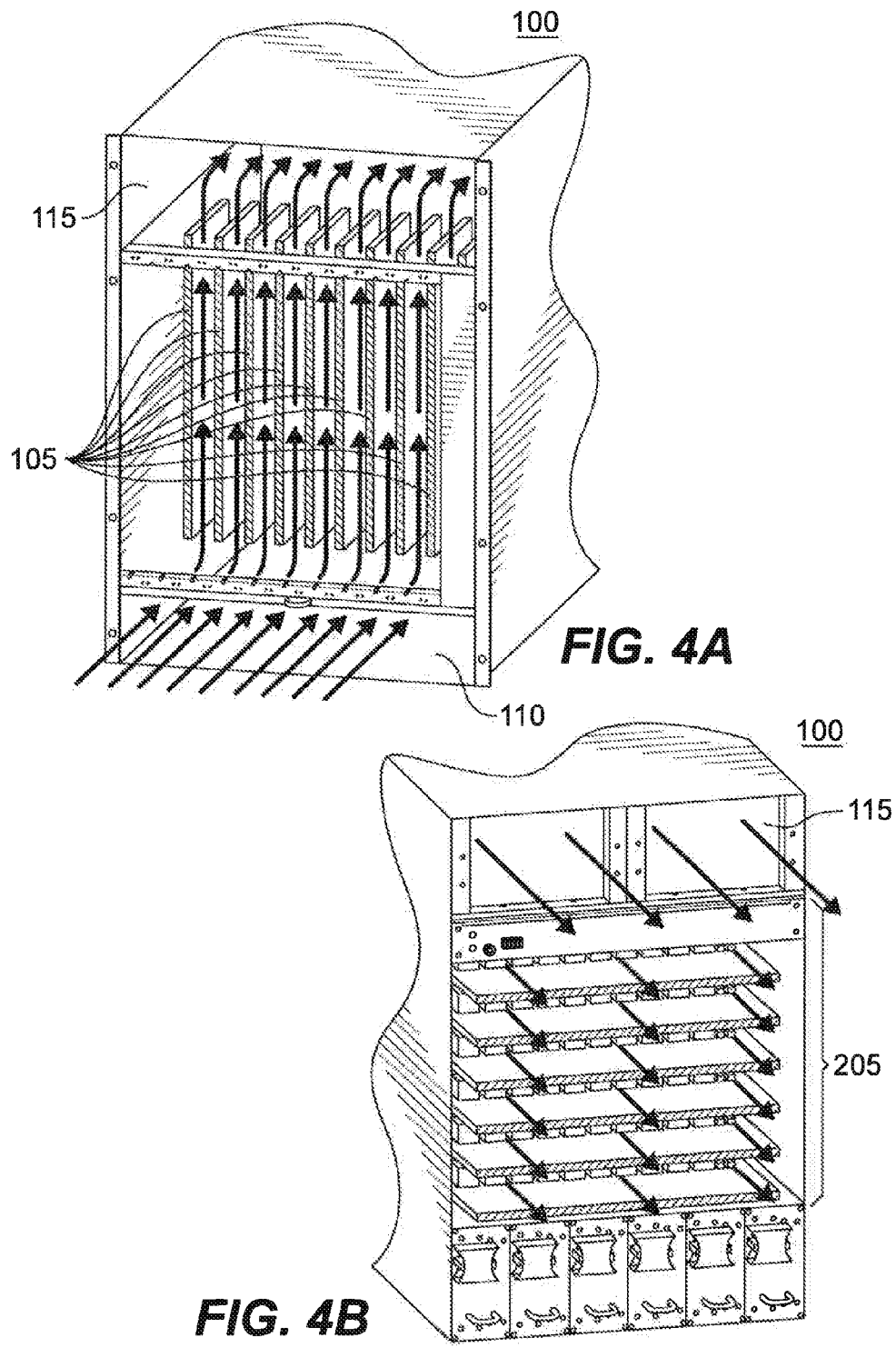
FIG. 4A illustrates a partially exposed front perspective view of the network chassis, showing airflow between the vertically mounted network circuit boards.
FIG. 4B illustrates a partially exposed rear perspective view of the network chassis, showing airflow between the vertically mounted network circuit boards and through exit openings on the rear of the orthogonal network chassis.

FIG. 4A illustrates a partial exposed front perspective view of airflow through network chassis 100, and FIG. 4B illustrate a partial exposed rear perspective view of airflow through network chassis 100. FIG. 4A particularly shows airflow through openings of air intake 110, through air filter 111, between each network card of the first plurality of network cards 105, through airflow assembly 115, toward the rear of network chassis 100. FIG. 4B particularly shows airflow between each network card of the second plurality of network cards 205 and through exit openings on the rear of network chassis 100.

Figure 5:
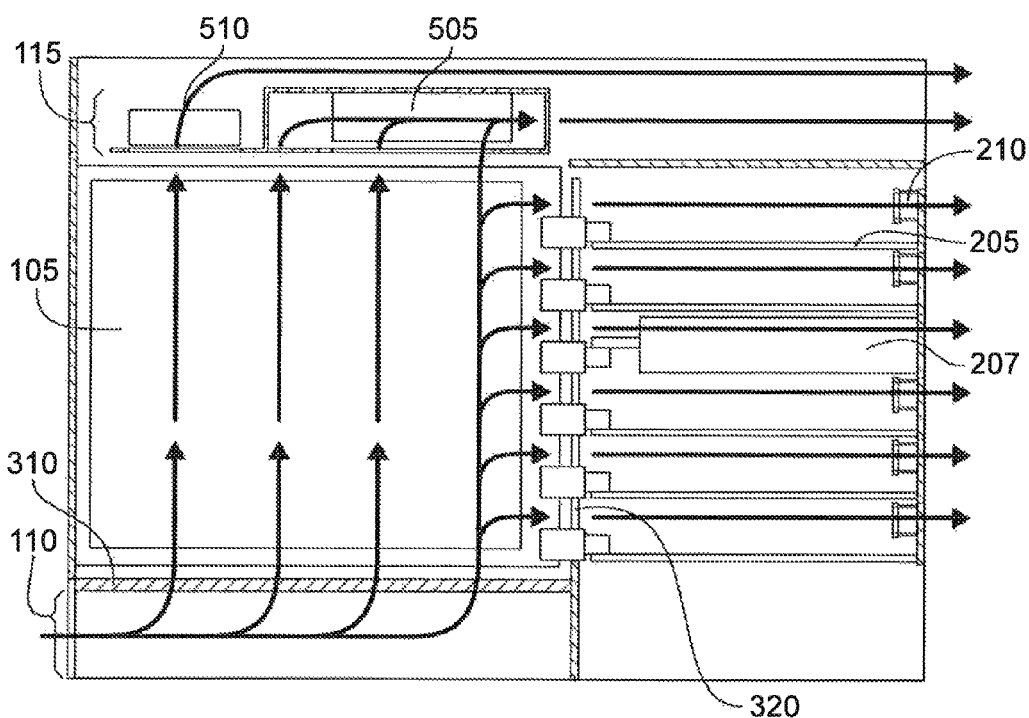
FIG. 5 illustrates a side elevation view of the network chassis, viewed at cut-lines 5-5 shown in FIG. 1, showing airflow through the vertically mounted network circuit boards and the horizontally mounted circuit boards in the network chassis.

FIG. 5 illustrates a side elevation of network chassis viewed at cut lines 5-5 shown in FIG. 1. As discussed above, air flows through network chassis, particularly entering a front side of network chassis 100 (e.g., through air intake 110), through air filter 111, through the network cards disposed therein, and exiting a rear side of network chassis (e.g., through exit openings).

As shown in FIG. 5, airflow assembly 115 includes a blower 505 and one or more auxiliary fans 510. Blower 505 and the auxiliary fans 510 collectively operate to create a pressure differential between an outside of network chassis 100 and the interior of network chassis 100. In particular, blower 505 and auxiliary fans 510 create a pressure differential that facilitates airflow through air intake 110, through air filter 111, between the first plurality of circuit boards 105, through airflow assembly 115, and exiting the rear of network chassis 100 (e.g., through one or more openings of airflow assembly 115). While blower 505 and auxiliary fans 510 facilitate airflow by moving air within network chassis 100 toward themselves, respectively, blower 505 further redirects the air in another direction—here, a direction toward the rear of network chassis 100.

As discussed above, output fans 210 are also mounted to corresponding circuit boards of the second plurality of circuit boards 205 (e.g., horizontally mounted circuit boards), and facilitate airflow through spaces between each of the second plurality of circuit boards, and exiting respective exit openings (which correspond to each output fan). Airflow for output fans 210 is particularly balanced against airflow from airflow assembly 115 to facilitate airflow throughout network chassis 100. As is appreciated by those skilled in the art, output fans 210 redirect a portion of airflow from the air intake 110 to flow between respective horizontal circuit boards 205 and through corresponding exit openings. Each output fan 210, blower 505, and auxiliary fan 510 are selected and/or programmed to account for relative rack position (e.g., speed, size, etc.) to maintain specific airflow between and/or temperature for corresponding network cards.

In the preferred embodiment of the invention, each blower 505 can generate around 600 CFM, each auxiliary fan 510 can generate around 200 CFM and each output fan 210 can generate around 30 CFM of air flow at zero pressure when running at their full rated speed. Actual speeds of the blowers and fans are controlled to maintain the temperatures of circuit boards 105 and circuit boards 205 in a comfortable range that is safe for their operation.

Figure 6:
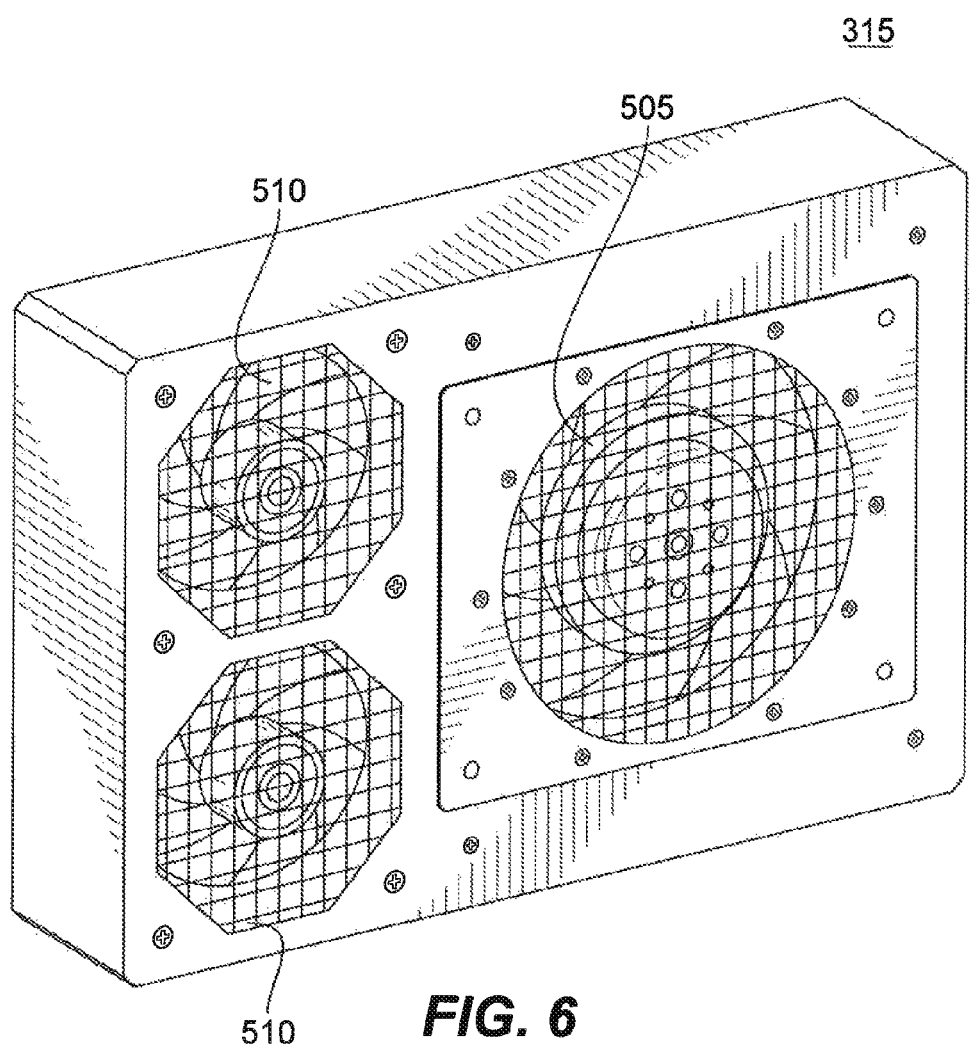
FIG. 6 illustrates a side perspective isometric view of an airflow assembly for the network chassis.

FIG. 6 illustrates a perspective isometric view of the air blower assembly 315, showing two auxiliary fans 510 and one blower 505. As discussed above, blower 505 and auxiliary fans 510 facilitate airflow by moving air within network chassis 100 toward themselves. Further, blower 505 also redirects the pulled air in another direction.

Figure 7:
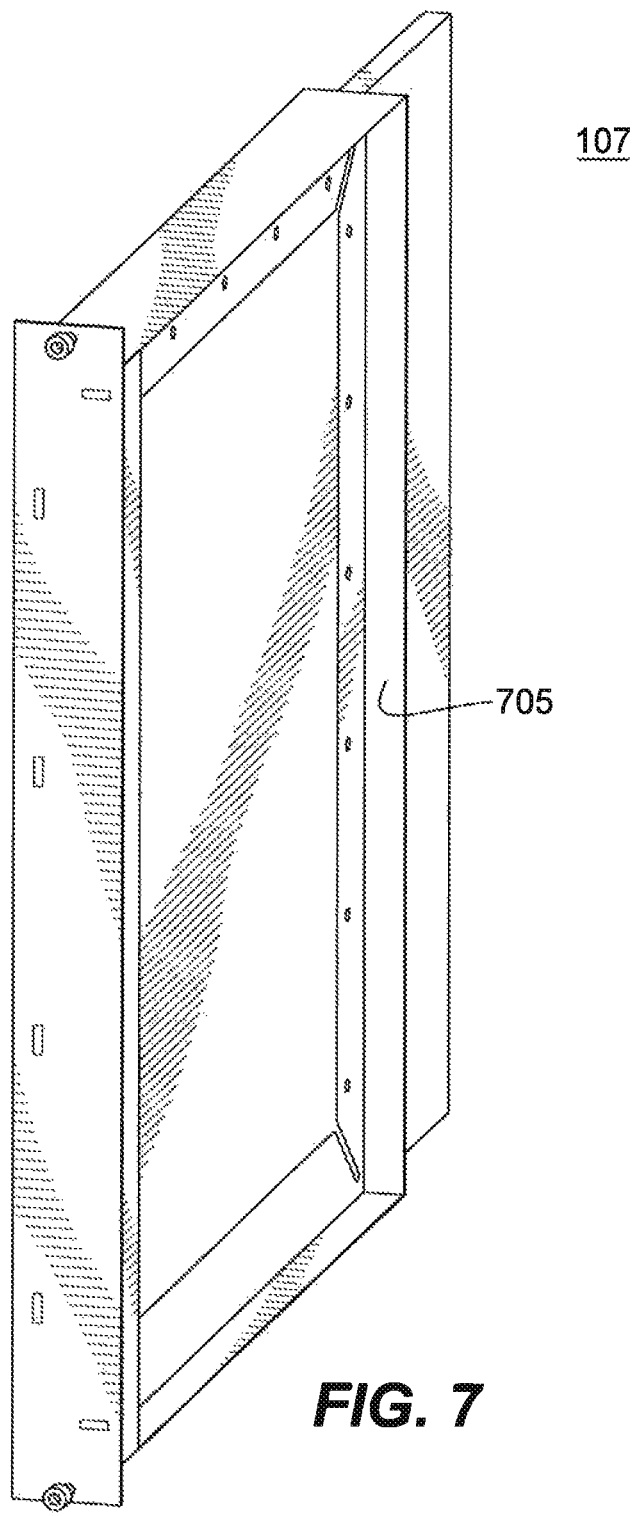
FIG. 7 illustrates a perspective isometric view of an impediment card for the network chassis.

FIG. 7 illustrates a perspective isometric view of impediment card 107 for vertical circuit boards. As shown, impediment card 107 includes a periphery of baffles 705, which impede or obstruct airflow in a similar (or the same) fashion as circuit board 105. Impediment card 107 is employed to maintain a balanced airflow throughout network chassis 100 in absence of one or more circuit boards from the first plurality of circuit boards.

Figure 8:
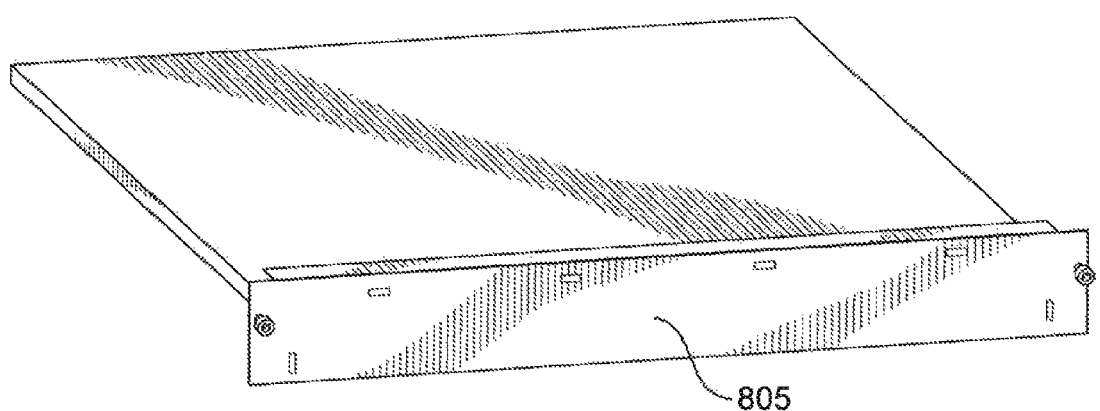
FIG. 8 illustrates a perspective isometric view of an impediment card for a horizontal circuit board.

FIG. 8 illustrates a perspective isometric view of impediment card 207 for horizontal circuit boards. As shown, impediment card 207 includes a front panel 805, which impedes or obstructs airflow from entering chassis 100 from the rear in absence of one or more circuit boards from the second plurality of circuit boards.

The systems, devices, and cooling architecture techniques described herein, therefore, provide for balanced airflow throughout a network chassis, particularly adapted for orthogonal equipment chassis, using airflow assemblies, air intakes, air filters and output fans for corresponding circuit boards. The techniques also provide impediment cards to maintain such balanced airflow throughout the network chassis in absence of certain circuit boards.

While there have been shown and described illustrative embodiments that provide for improved cooling architectures using specific numbers and types of components, it is to be understood that various other adaptations and modifications may be made within the spirit and scope of the embodiments herein. For instance, a single airflow device may obviate the need for separate airflow assembly 115 and output fans 210 whereby the single airflow device has at least a portion affixed in proximity to the rear surface of the housing. The aforesaid single airflow device is preferably configured and operational to facilitate airflow through the plurality of openings 110, and between each circuit board of the first plurality of circuit boards 105, and through the exit opening (thus obviating the need for the airflow assembly 115). Further, the aforesaid single airflow device redirects at least a portion of airflow facilitated by the intake 320 between each circuit board of the second plurality of circuit boards 205, and through the exit opening in the rear portion of chassis 100.

The foregoing description has been directed to specific embodiments. It will be apparent, however, that other variations and modifications may be made to the described embodiments, with the attainment of some or all of their advantages. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. An electronic equipment chassis assembly comprising:
   a housing having a top surface, a bottom surface opposite the top surface, a front surface, and a rear surface opposite the front surface, the front surface and the rear surface separating the top surface and the bottom surface;
   a plurality of openings defined in the housing that allow airflow there-through, the openings include at least one intake opening defined in a bottom portion of the front surface of the housing and a plurality of exit openings defined in the rear surface of the housing;
   a mid-plane located proximate an interior perimeter of the housing;
   one or more rails disposed within the housing defining receiving slots that releasably secure a first plurality of circuit boards and a second plurality of circuit boards in parallel configurations, respectively, and releasably secure the second plurality of circuit boards in an orthogonal orientation relative to the first plurality of circuit boards, wherein the second plurality of circuit boards are directly coupled to the first plurality of circuit boards by orthogonal connectors, the coupling being independent of the mid-plane;
   an airflow assembly positioned in the top surface of the housing, at least a portion of which is dispose above the one or more rails, the airflow assembly facilitates airflow through the plurality of openings defined in the housing, and between each of the first plurality of circuit boards secured in the one or more rails, and through the at least one exit opening wherein the airflow assembly includes at least one fan and at least one blower configured to create a pressure differential between an outside and inside portion of the housing to facilitate a first flow of air from the at least one intake opening that is redirected a first time between each of the first plurality of circuit boards and is redirected a second time via the at least one exit opening to exit the housing; and
   one or more output fans proximate the rear surface of the housing, wherein the one or more output fans redirect at least a portion of the first flow of air, after it is redirected the first time between each circuit board of the second plurality of circuit boards and through the at least one exit opening.

2. The electronic equipment chassis assembly of claim 1, further comprising an air filter operatively coupled to at least a portion of the intake openings.

3. The electronic equipment chassis assembly of claim 1, further comprising:
   a first set of one or more electrical connectors, each electrical connector configured to couple with at least one circuit board of the first plurality of circuit boards, and
   a second set of one or more electrical connectors, each electrical connector configured to couple with at least one circuit board of the second plurality of circuit boards, and
   wherein the first and second sets of one or more electrical connectors are disposed on a circuit board within the housing proximate an interior surface of the housing and parallel to a plane formed by an orthogonal interconnection between at least one circuit board of the first plurality of circuit boards and at least one circuit board of the second plurality of circuit boards.

4. The electronic equipment chassis assembly of claim 1, wherein the one or more rails disposed within the housing further defines a minimum distance between each receiving slot that releasably secures the first plurality of circuit boards and defines a minimum distance between each receiving slot that releasably secures the second plurality of circuit boards to facilitate airflow between each circuit board of the first plurality of circuit boards and each circuit board of the second plurality of circuit boards.

5. The electronic equipment chassis assembly of claim 1, wherein the at least one blower of the airflow assembly exhausts air in a direction that is substantially orthogonal to the direction of air being exhausted from the at least one fan.

6. The electronic equipment chassis assembly of claim 5 wherein the at least one blower and fan of the airflow assembly are contained in a common housing.

7. The electronic equipment chassis assembly of claim 1, further comprising:
   at least one impediment board configured to obstruct airflow substantially similar to at least one circuit board of the first plurality of circuit boards or the second plurality of circuit boards, the at least one impediment board disposed in each receiving slot not occupied by a circuit board of the first plurality of circuit boards or a circuit board of the second plurality of circuit boards.

8. The electronic equipment chassis assembly of claim 7, wherein the at least one impediment board comprises one or more baffles that obstruct the airflow.

9. The electronic equipment chassis assembly of claim 1, wherein the at least one intake opening is defined in the front surface of the housing proximate the bottom surface.

10. The electronic equipment chassis assembly of claim 1, wherein the one or more rails disposed within the housing further defines a minimum distance between each receiving slot that releasably secures the first plurality of circuit boards and defines a minimum distance between each receiving slot that releasably secures the second plurality of circuit boards to facilitate the airflow between each circuit board of the first plurality of circuit boards and each circuit board of the second plurality of circuit boards.

11. The electronic equipment chassis assembly of claim 1, further comprising:
   at least one impediment board configured to obstruct airflow substantially similar to at least one circuit board of the first plurality of circuit boards or the second plurality of circuit boards, the at least one impediment board disposed in each receiving slot not occupied by a circuit board of the first plurality of circuit boards or a circuit board of the second plurality of circuit boards.

12. The electronic equipment chassis assembly of claim 10, wherein the at least one impediment board comprises one or more baffles that obstruct the airflow.

13. The electronic equipment chassis assembly of claim 1, wherein the mid-plane is configured so that the first and second flows of air are substantially unobstructed by the mid-plane.

14. An electronic equipment chassis assembly comprising:
- a housing having a top surface, a bottom surface opposite the top surface, a front surface, and a rear surface opposite the front surface, the front surface and the rear surface separating the top surface and the bottom surface;
- a plurality of openings defined in the housing that allow airflow there-through, the openings include at least one intake opening defined in a bottom portion of the front surface of the housing and at least one exit opening defined in the rear surface of the housing;
- a mid-plane located proximate an interior perimeter of the housing;
- one or more rails disposed within the housing defining receiving slots that releasably secure a first plurality of circuit boards and a second plurality of circuit boards in parallel configurations, respectively, and releasably secure the second plurality of circuit boards in an orthogonal orientation relative to the first plurality of circuit boards, wherein the second plurality of circuit boards are directly coupled to the first plurality of circuit boards by orthogonal connectors, the coupling being independent of the mid-plane;
- an airflow cavity defined directly below the top surface of the housing and entirely above each of the one or more rails, the airflow cavity being configured to receive at least a portion of airflow through the plurality of openings defined in the housing, and between respective circuit boards of the first plurality of circuit boards secured in the one or more rails, and the cavity being configured to pass at least a portion of airflow through the at least one exit opening;
  - at least one airflow assembly having at least one fan and blower contained in the housing wherein the at least one blower exhausts a first flow of air in a direction that is substantially orthogonal to the direction of a second flow of air being exhausted from the at least one fan contained in the common housing, the at least one airflow assembly facilitating the first flow of air from the at least one intake opening that is redirected a first time between respective circuit boards of the first plurality of circuit boards and is redirected a second time via the at least one exit opening to exit the housing; and
- one or more output fans proximate the rear surface of the housing, wherein the one or more output fans redirect at least a portion of the first flow of air, after it is redirected the first time between respective circuit boards of the first plurality of circuit boards, to flow as a second air flow between respective circuit boards of the second plurality of circuit boards and through the at least one exit opening.

15. The electronic equipment chassis assembly of claim 14, wherein a plurality of airflow assemblies are positioned in the airflow cavity.

16. The electronic equipment chassis assembly of claim 14, further comprising an air filter operatively coupled to at least a portion of the intake openings.

17. The electronic equipment chassis assembly of claim 14, further comprising:
- a first set of one or more electrical connectors, each electrical connector configured to couple with at least one circuit board of the first plurality of circuit boards, and
- a second set of one or more electrical connectors, each electrical connector configured to couple with at least one circuit board of the second plurality of circuit boards, and
- wherein the first and second sets of one or more electrical connectors are disposed on a circuit board within the housing proximate an interior surface of the housing and parallel to a plane formed by an orthogonal interconnection between at least one circuit board of the first plurality of circuit boards and at least one circuit board of the second plurality of circuit boards.

18. The electronic equipment chassis assembly of claim 14, wherein mid-plane is configured so that the first and second flows of air are substantially unobstructed by the mid-plane.

19. An electronic equipment chassis assembly comprising:
- a housing having a top surface, a bottom surface opposite the top surface, a front surface, and a rear surface opposite the front surface, the front surface and the rear surface separating the top surface and the bottom surface;
- a plurality of openings defined in the housing that allow airflow there-through, the openings include at least one intake opening defined in a bottom portion of the front surface of the housing and a plurality of exit openings defined in the rear surface of the housing;
- a mid-plane located proximate an interior perimeter of the housing;
- one or more rails disposed within the housing defining receiving slots that releasably secure a first plurality of circuit boards and a second plurality of circuit boards in parallel configurations, respectively, and releasably secure the second plurality of circuit boards in an orthogonal orientation relative to the first plurality of circuit boards, wherein, at least one second exit opening of the plurality of exit openings corresponds to respective circuit boards of the second plurality of circuit boards, wherein the second plurality of circuit boards are directly coupled to the first plurality of circuit boards by orthogonal connectors, the coupling being independent of the mid-plane; and
- a plurality of fans positioned along a rear surface of the housing, the plurality of fans including at least one first fan that corresponds to at least one first exit opening of the plurality of exit openings, the at least one first fan being positioned at the top of the housing above the one or more rails, and at least one second fan that corresponds to at least one second exit opening of the plurality of exit openings, the at least one second fan being positioned to align with the one or more rails that are configured to receive the second plurality of circuit boards, the plurality of fans facilitating airflow through the plurality of openings defined in the housing, and between respective circuit boards of the first and second plurality of circuit boards secured in the one or more rails, and through the plurality of exit openings, the air flow including a first flow of air from the at least one intake opening that is redirected a first time between respective circuit boards of the first plurality of circuit boards and is redirected a second time via the at least one first exit opening to exit the housing, and a second flow of air that is redirected, by the at least one second fan, from at least a portion of the first flow of air, after it is redirected the first time between respective circuit boards of the first plurality of circuit boards, to flow as the second air flow between respective circuit boards of the second plurality of circuit boards through the at least one exit opening.

20. The electronic equipment chassis assembly of claim 19, wherein the mid-plane is configured so that the first and second flows of air are substantially unobstructed by the mid-plane.

\* \* \* \* \*